United States Patent
Chou et al.

(10) Patent No.: US 8,324,982 B2
(45) Date of Patent: *Dec. 4, 2012

(54) INTEGRATED FRONT-END PASSIVE EQUALIZER AND METHOD THEREOF

(75) Inventors: Gerchih Chou, San Jose, CA (US); Chia-Liang Lin, Fremont, CA (US)

(73) Assignee: Realtek Semiconductor Corp. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/371,079

(22) Filed: Feb. 10, 2012

(65) Prior Publication Data

US 2012/0139669 A1 Jun. 7, 2012

Related U.S. Application Data

(63) Continuation of application No. 13/048,292, filed on Mar. 15, 2011, now Pat. No. 8,115,566, which is a continuation of application No. 12/349,740, filed on Jan. 7, 2009, now Pat. No. 7,924,113.

(60) Provisional application No. 61/029,259, filed on Feb. 15, 2008.

(51) Int. Cl.
*H03H 7/38* (2006.01)
*H04B 3/14* (2006.01)

(52) U.S. Cl. .................................. 333/28 R; 333/32

(58) Field of Classification Search ............... 333/28 R, 333/32, 33

See application file for complete search history.

(56) References Cited

U.S. PATENT DOCUMENTS

| 7,394,331 | B2 | 7/2008 | Yeung et al. |
| 7,504,906 | B2 | 3/2009 | Chu |
| 7,586,987 | B2 | 9/2009 | Vorenkamp et al. |
| 7,924,113 | B2 | 4/2011 | Chou et al. |
| 8,115,566 | B2 | 2/2012 | Chou et al. |
| 2008/0238587 | A1 | 10/2008 | Shin et al. |

OTHER PUBLICATIONS

Gondi et al., Equalization and Clock and Data Recovery Techniques for 10-Gb/s CMOS Serial-Link Receivers, IEEE Journal of Solid-State Circuits, vol. 42, No. 9 Sep. 2007, pp. 1999-2011.

*Primary Examiner* — Stephen Jones
(74) *Attorney, Agent, or Firm* — Knobbe Martens Olson & Bear, LLP

(57) ABSTRACT

A passive equalizer circuit incorporated at a front-end of an integrated receiver circuit uses passive components that are distributed between inside and outside of an integrated circuit package. The passive equalizer circuit has off-chip components that are placed on a printed circuit board and on-chip components that are fabricated on a common integrated circuit die as a receiver chip. The on-chip components include one or more variable resistors for adjusting a degree of equalization. The off-chip components include one or more resistors for fine tuning input impedance matching of the integrated receiver circuit.

20 Claims, 5 Drawing Sheets

INTEGRATED FRONT-END PASSIVE EQUALIZER AND METHOD THEREOF

This application is a continuation of U.S. patent application Ser. No. 13/048,292, filed Mar. 15, 2011, titled "Integrated Front-End Passive Equalizer And Method Thereof", which is a continuation of Ser. No. 12/349,740, filed Jan. 7, 2009, titled "Integrated Front-End Passive Equalizer And Method Thereof", which claims the benefit of priority under 35 U.S.C. §119(e) of U.S. Provisional Application No. 61/029,259, filed on Feb. 15, 2008 and titled "Integrated Front-End Passive Equalizer and Method Thereof," which the entireties of each are incorporated herein by reference.

BACKGROUND OF THE INVENTION

1. Field of the Invention

The present invention relates to a passive equalizer circuit and in particular to a passive equalizer circuit that is incorporated in a front-end of an integrated receiver circuit.

2. Description of the Related Art

High-speed serial data transmission is employed in many signal interfacing standards (e.g., PCI Express, HDMI, and so on). A high-speed serial data transmission system typically includes a transmitter on a source side for generating an electrical signal (e.g., a voltage/current signal) to represent serial data based on a two-level signaling scheme (e.g., a high level to represent logically "1" data and a low level to represent logically "0" data). The high-speed serial data transmission system also includes a transmission line for delivering the electrical signal from the source side to a destination side and a receiver for receiving the delivered electrical signal and detecting the serial data embedded in the electrical signal. The transmission line can be a cable, a PCB (printed circuit board) trace, or a combination of both. In general, the transmission line behaves similarly to a low-pass filter, which causes more attenuation to a high-frequency component of the electrical signal than to a low-frequency component of the electrical signal. As a result, the electrical signal delivered to the destination side is distorted, and a correct detection of the serial data is sometimes difficult unless a proper equalization is performed in the receiver. Equalization seeks to equalize the overall gain in the entire data transmission path for different frequency components in the electrical signal. Since the transmission line behaves similarly to a low-pass filter, a receiver usually employs a high-pass filter for equalization.

In a recent trend, most of the receiver's functions are integrated in a semiconductor integrated circuit (IC). In particular, a receiver IC usually includes an on-chip equalization circuit. Prior art on-chip equalization circuits usually perform equalization using an amplifier with an inductive load or an RC-degenerated amplifier. Such equalization schemes usually demand considerable power consumption due to the nature of using active circuits. What is needed is a passive equalization scheme for an integrated receiver.

SUMMARY OF THE INVENTION

The present invention solves these and other problems by providing a method and an apparatus for a passive equalizer circuit that is partially integrated with a receiver chip in a high-speed communication system. One method of equalizing communication signals uses passive circuits that are distributed between inside and outside of an IC package. In one embodiment, the passive equalizer circuit includes a first passive circuit placed outside of an IC package of the receiver chip (e.g., off-chip) and a shunt circuit fabricated on an IC die with the receiver chip (e.g., on-chip). The first passive circuit couples a first input signal from a first transmission line to a first IC package pin. In one embodiment, the first passive circuit is placed (or assembled) on a PCB and comprises a first resistor coupled in series between the first transmission line and the first IC package pin. The first IC package pin is coupled to a first IC pad on the IC die inside the IC package using a first bond wire. The shunt circuit is coupled in a parallel configuration (or in shunt) with a first input of the receiver chip to the first IC pad. The shunt circuit comprises a series resistor-inductor network.

In one embodiment, the high-speed communication system communicates using differential signals and the passive equalizer circuit further includes a second passive circuit placed outside the IC package of the receiver chip. The second passive circuit comprises a second resistor coupled in series between a second transmission line and a second IC package pin. The second IC package pin is coupled to a second IC pad on the IC die inside the IC package using a second bond wire. The shunt circuit is coupled across the first and the second IC pads. The second IC pad is coupled to a second input of the receiver chip, and an equalized differential signal is provided across the first and the second inputs (i.e., differential input terminals) of the receiver chip when an input differential signal is transmitted across the first and the second transmission lines (i.e., differential transmission lines).

A transmission line in the high-speed communication system includes a cable, a PCB trace, or a combination of both. In some applications, the transmission line carries signals comprising embedded serial data transmitted at a rate of 1-10 Giga Bits Per Second. The passive equalizer circuit is a front-end circuit and can also be configured to provide impedance matching and AC coupling. For example, a first capacitor is coupled in series between the first transmission line and the first resistor in the first passive circuit (e.g., a first series resistor-capacitor circuit) to provide AC coupling. Similarly, a second capacitor is coupled in series between the second transmission line and the second resistor in the second passive circuit (or a second series resistor-capacitor circuit) to provide AC coupling. In some applications, the first capacitor and the second capacitor are each approximately 1 nF-1 µF. A combination of the first resistor and one or more resistors in the shunt circuit can be used to approximately match a characteristic impedance (e.g., a single-ended impedance) of the first transmission line. Similarly, a combination of the first resistor, the second resistor, and one or more resistors in the shunt circuit can be used to approximately match a differential impedance across the first and the second transmission lines.

In one implementation suitable for processing differential signals, the series resistor-inductor network of the shunt circuit comprises a center-tapped inductor coupled in series with one or more resistors. For example, a third resistor is coupled between the first IC pad and a first terminal of the inductor while a fourth resistor is coupled between the second IC pad and a second terminal of the inductor. A center tap of the inductor is coupled to a substantially fixed voltage potential. In another implementation suitable for processing single-ended signals, the series resistor-inductor network of the shunt circuit comprises an inductor coupled in series with at least one resistor between the first IC pad and a substantially fixed voltage potential. The inductor of the series resistor-inductor network has an inductance that is greater than an inductance of a bond wire. In one embodiment, the inductor's inductance is approximately 3-5 times greater than the inductance of the bond wire.

In some applications, the receiver chip has an input impedance that is at least three times higher than an impedance of the shunt circuit. In one embodiment, one or more of the resistors in the series resistor-inductor network are variable (e.g., in response to a control signal). For example, the third and the fourth resistor can be varied (or tuned) to adjust a gain difference of the passive equalizer circuit over a frequency range. The third and the fourth resistor also affect transmission line impedance matching. In one embodiment, the resistors in the shunt circuit provide coarse tuning for impedance matching while the resistors in the first and the second passive circuits provide fine tuning for impedance matching. In one implementation, the first and the second resistors are each approximately 10 Ohms while the third and the fourth resistors are each approximately 40 Ohms to approximately match 100 Ohms differential transmission lines while providing a desired level of equalization (e.g., a 6 dB gain difference over a 2 GHz frequency range).

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF THE INVENTION

The present invention relates to a passive equalizer and in particular to a passive equalizer that is incorporated in a front-end of an integrated receiver circuit. While the specification describes several example embodiments of the invention considered best modes of practicing the invention, it should be understood that the invention can be implemented in many ways and is not limited to the particular examples described below or to the particular manner in which any features of such examples are implemented. In some instances, well-known details are not shown or described to avoid obscuring aspects of the invention.

Figure 1:
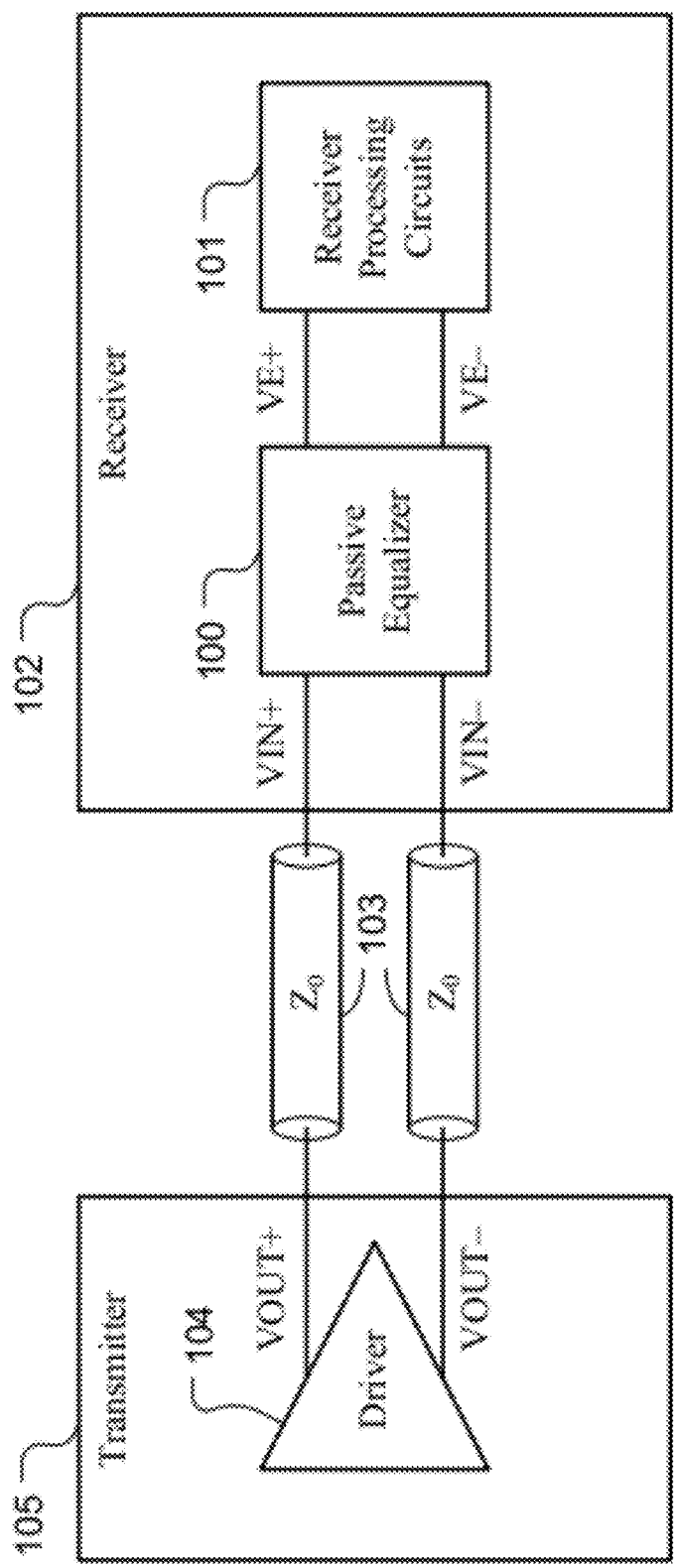
FIG. 1 illustrates one example of a high-speed communication system.

FIG. 1 illustrates one example of a high-speed communication system with a passive equalizer 100 incorporated at a front-end of a receiver 102 with an IC receiver chip 101. A driver circuit 104 outputs a differential signal (VOUT+, VOUT−) at a source (e.g., a transmitter 105) that is communicated to a destination (e.g., the receiver 102) using transmission lines 103. The transmission lines 103 may include cables, PCB traces or other transmission mediums that attenuate the differential signal from the source in a non-uniform manner across a desired frequency range (e.g., with higher losses for higher frequency components of the differential signal). The passive equalizer 100 at the destination receives the attenuated differential signal (VIN+, VIN−) from the transmission lines 103 and compensates for the non-uniform attenuation (or frequency distortion) to generate an equalized differential signal (VE+, VE−) for the IC receiver chip 101.

In one configuration, the passive equalizer 100 uses a distributed network of components with some passive components integrated on a common IC die with the IC receiver chip 101 and other passive components (e.g., discrete parts) placed outside of the IC receiver chip 101 on a printed circuit board (PCB) for the receiver 102. The passive components outside the IC receiver chip 101 are connected to the passive components on the common IC die by IC package pins, bond wires, and IC pads. The IC pads are effectively capacitive (e.g., 0.2 pF-1 pF) and greatly limits high frequency performance. The bond wires are effectively inductive (e.g., 1 nH-10 nH). In this configuration, the passive equalizer 100 accounts for the capacitive effects of IC pads and the inductive effects of bond wires to improve high frequency performance. The passive equalizer 100 can also provide AC coupling and impedance matching for the transmission lines 103.

Figure 2:
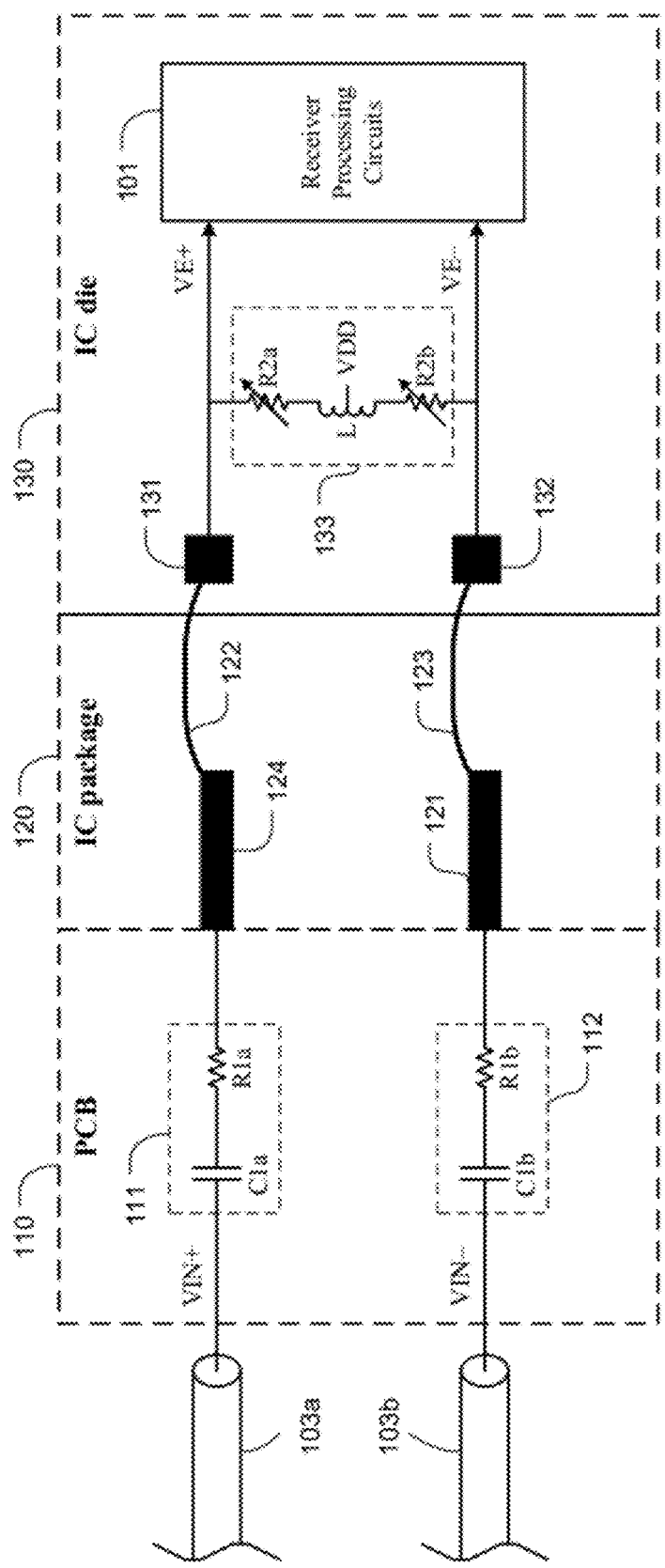
FIG. 2 is a schematic diagram illustrating one embodiment of a passive equalizer circuit incorporated at a front-end of a receiver for equalizing a differential signal.

FIG. 2 is a schematic diagram illustrating one embodiment of a passive equalizer incorporated at a front-end of a receiver for equalizing an input differential signal received from a pair of transmission lines 103. The passive equalizer (or front-end circuit) comprises a part in a PCB 110, a part in an IC package 120, and a part in an IC die 130 with a receiver chip 101. For example, the part in the PCB 110 comprises two series resistor-capacitor (RC) circuits 111, 112, the part in the IC package 120 comprises IC package pins 124, 121 and bond wires 122, 123, and the part in the IC die 130 comprises IC pads 131, 132 and a shunt circuit 133.

In one embodiment, the pair of series RC circuits 111, 112 placed outside of the IC package is configured to electrically couple the pair of transmission lines 103 to the pair of IC package pins 124, 121. For example, the first series RC circuit 111 comprises a first capacitor C1$a$ and a first resistor R1$a$ connected in series between the first transmission line 103$a$ and the first IC package pin 124. The second series RC circuit 112 comprises a second capacitor C1$b$ and a second resistor R1$b$ connected in series between the second transmission line 103$b$ and the second IC package pin 121. The first transmission line 103$a$ and the second transmission line 130$b$ are configured as a pair to provide a differential voltage signal comprising a positive end (VIN+) and a negative end (VIN−).

The first capacitor C1$a$ and the second capacitor C1$b$ function to block a DC component of the differential voltage signal. It is acceptable to remove the DC component since it carries no useful information. It is also desirable to remove the DC component since the differential voltage signal's DC level may be incompatible with a voltage range employed by the receiver chip 101. The first resistor R1$a$ and the second resistor R1$b$ work with the shunt circuit 133 to provide a desired level of equalization and impedance matching. In particular, the first resistor R1$a$ and the second resistor R1$b$ facilitate fine adjustments for an input impedance of the receiver to approximately match a characteristic impedance ($Z_0$) of the transmission lines 103. In one embodiment, the first resistor R1$a$ and the second resistor R1$b$ are variable (e.g., at manufacturing or during operation in response to a control signal). The series RC circuits 111, 112 can be fabricated on the PCB or can be discrete components assembled on the PCB.

The pair of bond wires 122, 123 in the IC package 120 are electrically coupled between the pair of IC package pins 124, 121 and the pair of IC pads 131, 132 on the IC die 130 inside the IC package 120. In one embodiment, the shunt circuit 133 in the IC die 130 comprises a series resistor-inductor network that is electrically coupled between the pair of IC pads 131, 132. An equalized differential signal (VE+, VE−) is provided across the pair of IC pads 131, 132 and provided to a differential input of the receiver chip 101. The series resistor-inductor network 133 and receiver processing circuits of the receiver chip 101 are fabricated on the same IC die 130.

In one embodiment, the series resistor-inductor (R-L) network 133 comprises a pair of tunable resistors R2a, R2b and a center-rapped inductor L. For example, the first tunable resistor R2a is coupled between the first IC pad 131 and a first terminal of the inductor L. The second tunable resistor R2b is coupled between the second IC pad 132 and a second terminal of the inductor L. The center-tap of the inductor L is coupled to a substantially fixed-potential node on the IC die 130 (e.g., VDD or other substantially fixed supply voltage).

The equalized differential signal (VE+, VE−) across the pair of IC pads 131, 132 sees a shunt impedance comprising the tunable resistors (R2a, R2b) and the center-tapped inductor L of the series R-L network 133. As described above, the equalized differential signal is provide to the differential input of the receiver chip (or on-chip receiver) 101. The differential input of the receiver chip 101 has an input impedance that is substantially higher (e.g., at least 3 times higher) than the shunt impedance. Thus, the series R-L network 133 exhibits a high-pass response and effectively realizes an equalization function with a degree of equalization mostly determined by a time constant of the series R-L network 133. In one embodiment, the first tunable resistor R2a and the second tunable resistor R2b have approximately equal resistance values (e.g., $R_e$). If the inductor L has an inductance of $L_e$, then the time constant (τ) of the series R-L network 133 is approximately $\tau = L_e/(2 R_e)$.

A greater time constant τ leads to a higher relative boost to a high frequency component in the equalized differential signal. Thus, the degree (or level) of equalization can be adjusted by adjusting the time constant τ. For example, the time constant τ may be increased to increase the degree of equalization in response to increased high frequency attenuation in the transmission lines 103 and/or IC packaging. The time constant τ may be adjusted by adjusting the inductor L and/or the tunable resistors R2a, R2b. The inductance of the inductor L is equal to or greater (e.g., 3-5 times greater) than the inductance of the bond wires 122, 123. In one embodiment, the inductance of the inductor L is not adjusted while the tunable resistors R2a, R2b are varied to change the degree of equalization for the passive equalizer. The tunable resistors R2a, R2b can be varied in response to a control signal or by numerous other methods known to those of ordinary skill in the art and are thus not described in further detail.

As discussed above, the passive equalizer also functions to approximately match the input impedance of the receiver to the characteristic impedance of the transmission lines 103. In one embodiment, the resistance value of the first resistor R1a is adjusted such that a combined resistance of the first resistor R1a and the first tunable resistor R2a is approximately equal to a single-ended characteristic impedance of the first transmission line 103a. Similarly, the resistance value of the second resistor R1b is adjusted such that a combined resistance of the second resistor R1b and the second tunable resistor R2b is approximately equal to a single-ended characteristic impedance of the second transmission line 103b. Thus, the passive equalizer uses a combination of external resistors (e.g., the first resistor R1a and the second resistor R1b) and on-chip resistors (e.g., the first tunable resistor R2a and the second tunable resistor R2b) to provide impedance matching at different levels of equalization.

Figure 3:
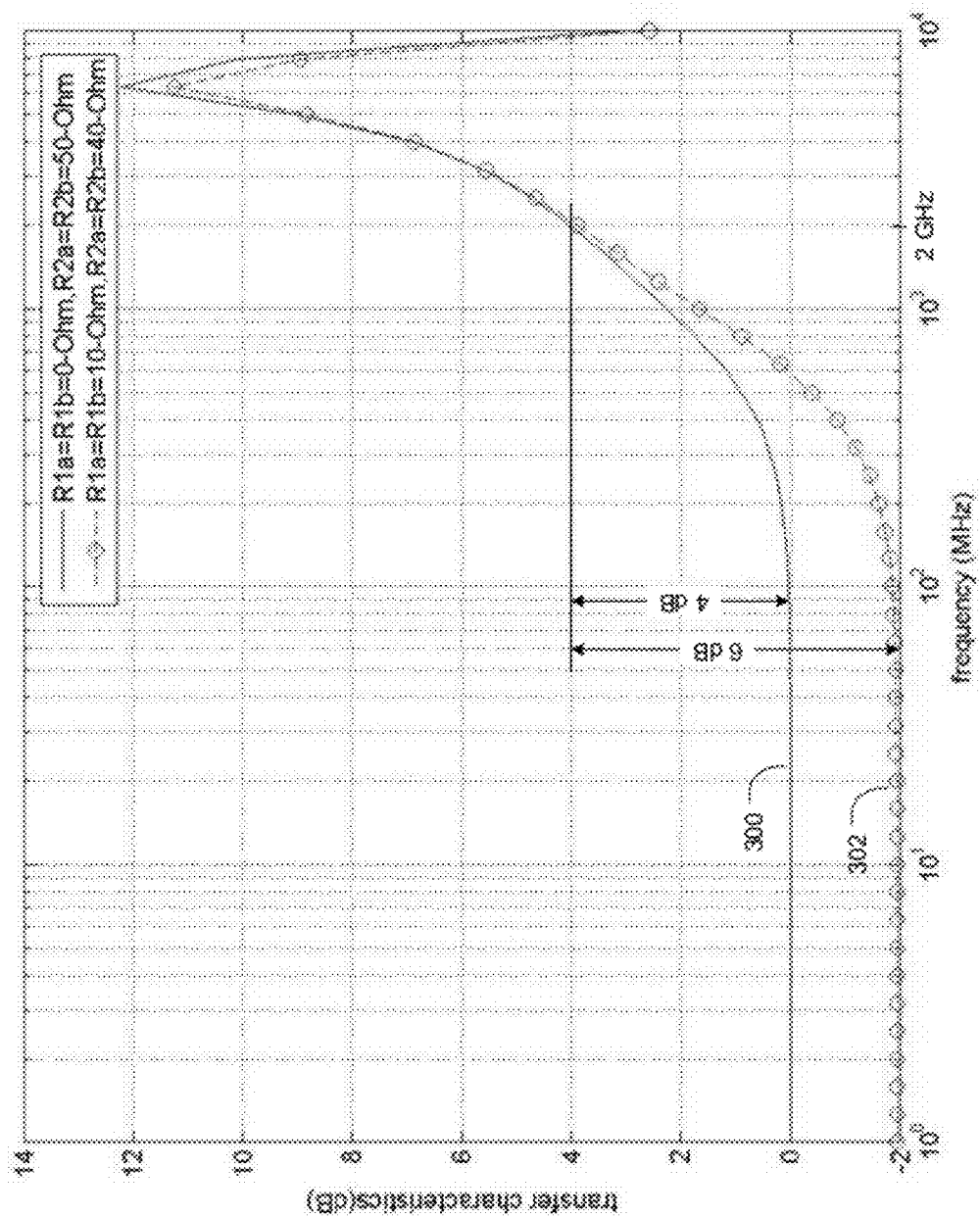
FIG. 3 is a graph illustrating transfer characteristics of the passive equalizer circuit shown in FIG. 2.
Figure 4:
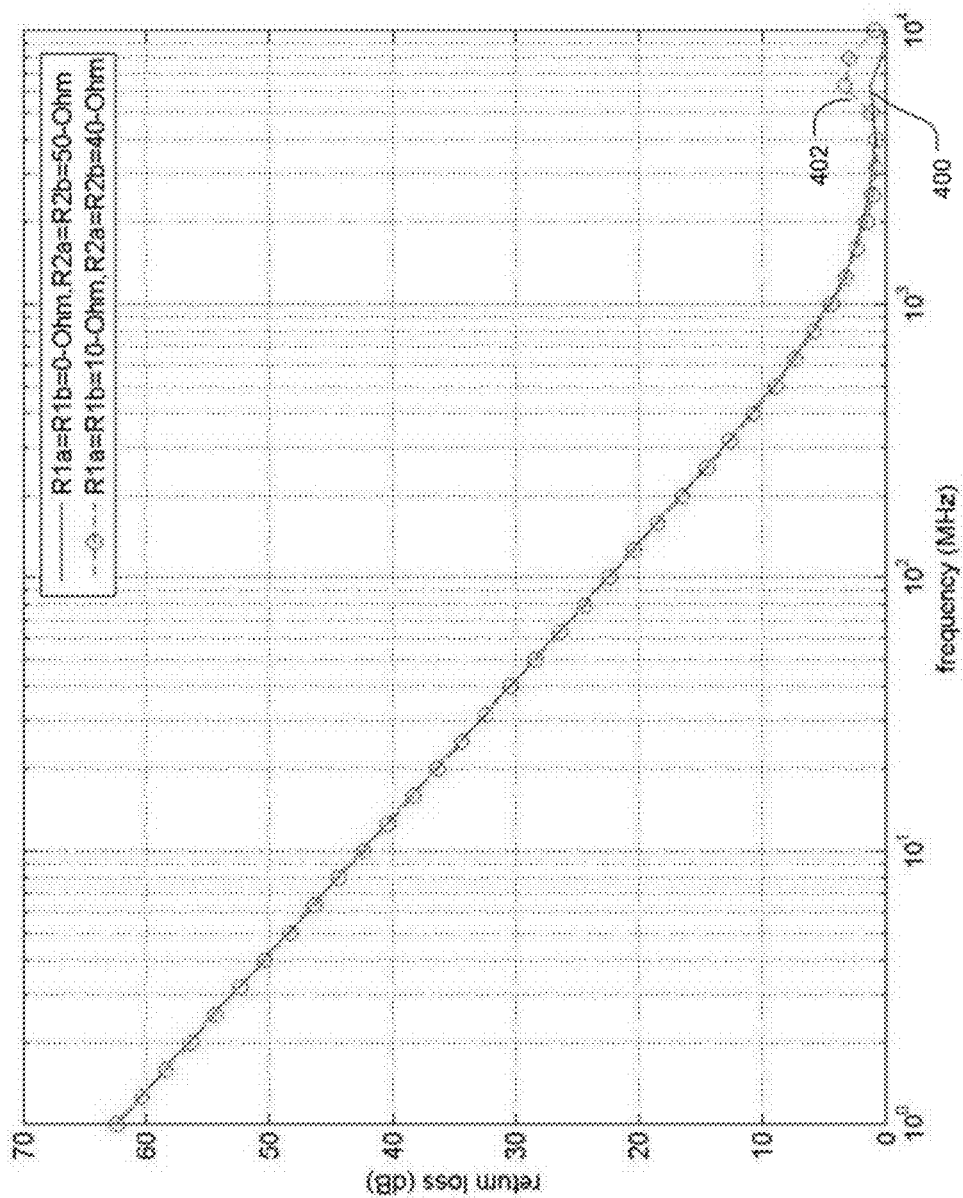
FIG. 4 is a graph illustrating return losses of the passive equalizer circuit shown in FIG. 2.

By way of example, FIG. 3 illustrates waveforms from a circuit simulation showing two different levels of equalization for two different sets of resistor values in the passive equalizer while FIG. 4 shows associated return losses that indicate similar impedance matching for both sets of resistor values. In this circuit simulation, the single-ended characteristic impedance ($Z_0$) of the transmission lines 103 is about 50 Ohms, the bond wire inductance is about 2.5 nH, the pad capacitance is about 0.25 pF, and the inductor L is about 20 nH.

A graph 300 in FIG. 3 shows the transfer characteristic of the passive equalizer with respect to frequency for the first set of resistor values (e.g., R1a=R1b=0 Ohm, R1a=R2b=50 Ohms). A graph 302 shows the transfer characteristic of the passive equalizer with respect to frequency for the second set of resistor values (e.g., R1a=R1b=10 Ohm, R1a=R2b=40 Ohms). The time constant for the second set of resistor values is higher so the level of equalization is greater for the second set of resistor values. For example, the first set of resistor values provides about a 4 dB boost while the second set of resistor values provides about a 6 dB boost with respect to DC at a high frequency point of interest (i.e., 2 GHz).

A graph 400 in FIG. 4 shows the return loss of the passive equalizer with respect to frequency for the first set of resistor values and a graph 402 shows the return loss for the second set of resistor values. For most of the frequency range, including 2 GHz, the return loss is approximately the same. Thus, the passive equalizer has similar impedance matching for both the first and the second sets of resistor values. In other words, the external resistors (e.g., R1a and R1b) help to preserve the passive equalizer's performance in impedance matching for different levels of equalization.

Figure 5:
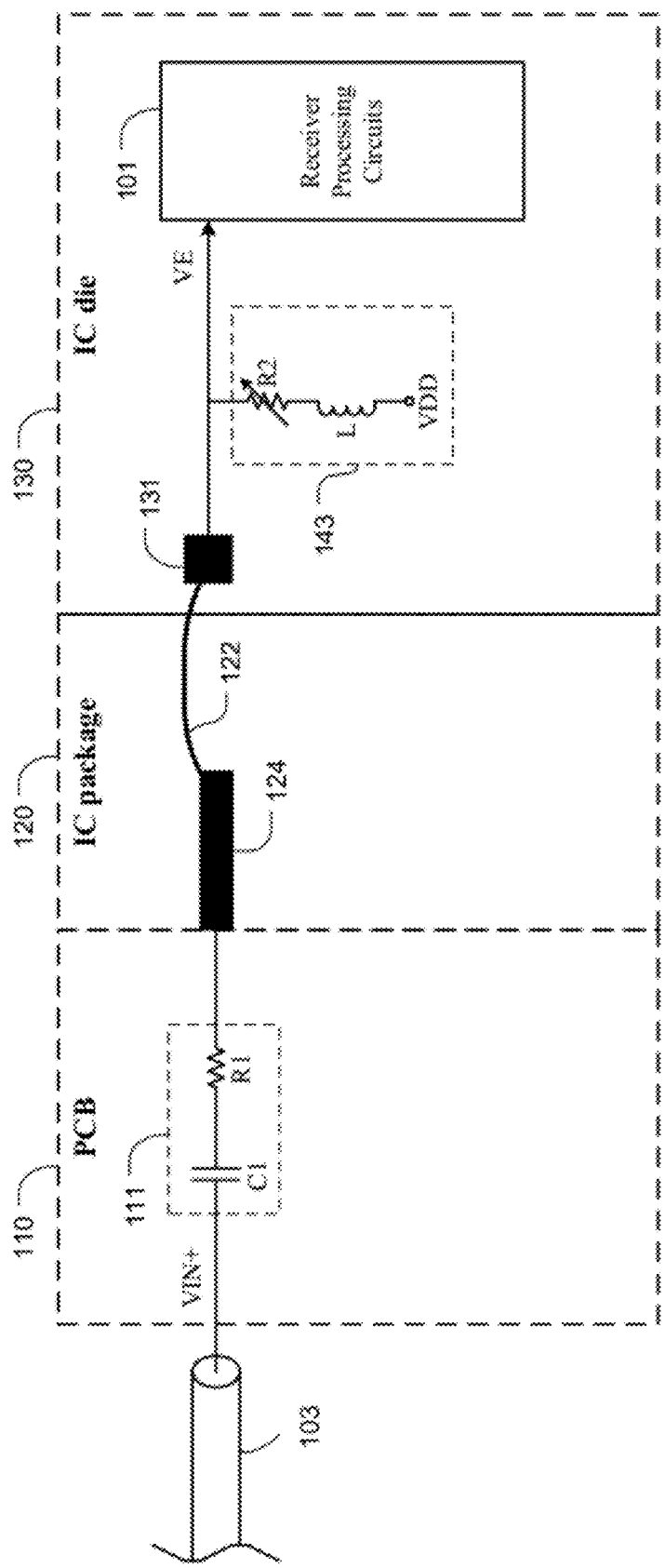
FIG. 5 is a schematic diagram illustrating one embodiment of a passive equalizer circuit incorporated at a front-end of a receiver for equalizing a single-ended signal.

The principle of the present invention can be practiced in many alternative embodiments without departing from the scope of the present invention. For example, the passive equalizer is not limited to a differential signaling scheme. FIG. 5 is a schematic diagram illustrating one embodiment of a passive equalizer incorporated at a front-end of a receiver for equalizing a single-ended signal (VIN). Similar to the passive equalizer of FIG. 2, the passive equalizer in FIG. 5 has parts distributed among a PCB 110, an IC package 120, and an IC die 130. For example, an external passive circuit 111 comprising a DC blocking capacitor C1 coupled in series with a resistor R1 is placed on the PCB 110 to connect a transmission line 103 to an IC package pin 124 in the IC package 120. A bond wire 122 connects the IC package pin 124 to an IC pad 131 on the IC die 130. A shunt circuit 143 is connected in a parallel configuration with an input of a receiver chip 101. The shunt circuit 143 and the receiver chip 101 are fabricated on the common IC die 130.

In one embodiment, the shunt circuit 143 comprises an inductor L coupled in series with a variable resistor R2 between the IC pad 131 and a substantially fixed voltage potential (e.g., VDD or AC ground). A combination of the variable resistor R2 and the resistor R1 is used to provide impedance matching. The inductor L and the variable resistor R2 establishes a time constant for the shunt circuit 143. The variable resistor R2 is adjustable to change a gain difference of the passive equalizer over a frequency range (i.e., degree of equalization). The resistor R1 can be adjusted to preserve impedance matching for different degrees of equalization.

While certain embodiments of the inventions have been described, these embodiments have been presented by way of example only, and are not intended to limit the scope of the inventions. Indeed, the novel methods and devices described herein may be embodied in a variety of other forms; furthermore, various omissions, substitutions, and changes in the form of the methods and devices described herein may be made without departing from the spirit of the inventions. The accompanying claims and their equivalents are intended to cover such forms or modifications as would fall within the scope and spirit of the inventions.

What is claimed is:

1. A distributed passive equalizer for a receiver chip comprising:
    a first part in a printed wiring board for a receiver chip;
    a second part in an IC package for the receiver chip; and
    a third part in an IC die with the receiver chip, the first part coupled in series between a first transmission line and the second part, the second part including a first IC package pin, a first IC pad, and a first bond wire, the third part in a parallel configuration with a first input of the receiver chip to the second part.

2. The distributed passive equalizer of claim 1 wherein the first bond wire couples the first IC package pin and the first IC pad on the IC die inside the IC package.

3. The distributed passive equalizer of claim 1 wherein the third part and receiver processing circuits of the receiver chip are fabricated on the IC die.

4. The distributed passive equalizer of claim 1 wherein the first part includes a first passive component.

5. The distributed passive equalizer of claim 4 wherein the first passive component couples in series between the first transmission line and the first IC package pin.

6. The distributed passive equalizer of claim 1 wherein the third part includes a shunt circuit coupled in a parallel configuration with the first input of the receiver chip to the first IC pad.

7. The distributed passive equalizer of claim 6 wherein the shunt circuit includes a series passive component network between the first IC pad and a substantially fixed voltage potential.

8. The distributed passive equalizer of claim 1 wherein the first part, the second part, and the third part are used to provide impedance matching of the first transmission line and to generate an equalized signal at the first input of the receiver chip.

9. The distributed passive equalizer of claim 8 wherein the first part includes a first series passive circuit coupled in series between the first transmission line and the first IC package pin, and the third part includes a series passive component network formed on the IC die with the receiver chip in a parallel configuration with the first input of the receiver chip to the first IC pad.

10. The distributed passive equalizer of claim 1 further comprising:
    a fourth part in the printed wiring board for the receiver chip;
    a fifth part in the IC package for the receiver chip; and
    a sixth part in the IC die with the receiver chip, the fourth part coupled in series between a second transmission line and the fifth part, the fifth part including a second IC package pin, a second IC pad, and a second bond wire, the sixth part in a parallel configuration with a second input of the receiver chip to the fifth part such that an equalized differential signal is provided across the first and second inputs of the receiver chip when an input differential signal is transmitted across the first and second transmission lines.

11. The distributed passive equalizer of claim 10 wherein the fourth part includes a second passive component coupled in series between the second transmission line and the second IC package pin.

12. The distributed passive equalizer of claim 10 wherein the second bond wire couples the second IC package pin and the second IC pad on the IC die inside the IC package.

13. The distributed passive equalizer of claim 10 wherein the sixth part includes a shunt circuit coupled in a parallel configuration with the second input of the receiver chip to the second IC pad.

14. The distributed passive equalizer of claim 13 wherein the shunt circuit includes a series passive component network between the second IC pad and a substantially fixed voltage potential.

15. A method of equalizing transmitted signals using distributed passive circuits, the method comprising:
    coupling in series a first passive part in a printed wiring board for a receiver chip between a first transmission line and a second passive part in an IC package for the receiver chip, the second passive part including a first IC package pin, a first IC pad, and a first bond wire coupling the first IC package pin to the first IC pad; and
    coupling a third passive part in an IC die with the receiver chip in a parallel configuration with the second passive part to a first input of the receiver chip.

16. The method of claim 15 wherein the first passive part includes a first passive component coupled in series between the first transmission line and the first IC package pin.

17. The method of claim 15 wherein the third passive part includes a shunt circuit coupled in a parallel configuration with the first input of the receiver chip to the first IC pad on the IC die inside the IC package.

18. The method of claim 17 wherein the shunt circuit includes a series passive component network.

19. The method of claim 15 further comprising providing impedance matching of the first transmission line using the first and third passive parts.

20. The method of claim 19 further comprising generating an equalized signal at the first input of the receiver chip using the first and third passive parts.

* * * * *